United States Patent
Shih

(10) Patent No.: US 7,343,531 B2
(45) Date of Patent: Mar. 11, 2008

(54) METHOD FOR INTERLEAVING DATA FRAME AND CIRCUIT THEREOF

(75) Inventor: Ying-Heng Shih, Pingtung (TW)

(73) Assignee: Benq Corporation, Taoyuan (TW)

( * ) Notice: Subject to any disclaimer, the term of this patent is extended or adjusted under 35 U.S.C. 154(b) by 508 days.

(21) Appl. No.: 11/103,932

(22) Filed: Apr. 12, 2005

(65) Prior Publication Data
US 2005/0234862 A1 Oct. 20, 2005

(30) Foreign Application Priority Data
Apr. 12, 2004 (TW) .............................. 93110101 A

(51) Int. Cl.
*H03M 13/27* (2006.01)
(52) U.S. Cl. .................................................. 714/702
(58) Field of Classification Search ................. 714/702
See application file for complete search history.

(56) References Cited

U.S. PATENT DOCUMENTS

| | | | |
|---|---|---|---|
| 6,543,013 B1* | 4/2003 | Li et al. ..................... | 714/701 |
| 6,598,202 B1* | 7/2003 | Kim et al. .................. | 714/786 |
| 6,845,482 B2* | 1/2005 | Yao et al. ................... | 714/755 |
| 7,155,642 B2* | 12/2006 | Han ........................... | 714/701 |
| 7,170,432 B2* | 1/2007 | Ettorre ....................... | 341/81 |
| 7,210,076 B2* | 4/2007 | Maru ......................... | 714/702 |
| 2003/0023909 A1* | 1/2003 | Ikeda et al. ................ | 714/702 |
| 2003/0221084 A1* | 11/2003 | Zhou ......................... | 711/209 |
| 2004/0103359 A1* | 5/2004 | Molina ....................... | 714/763 |
| 2004/0220988 A1* | 11/2004 | Barry et al. ................ | 708/446 |

* cited by examiner

Primary Examiner—Stephen M. Baker
(74) Attorney, Agent, or Firm—Snell & Wilmer L.L.P.

(57) ABSTRACT

A method, adapted to a 3GPP turbo coder, for interleaving a plurality of data of a data frame and a circuit thereof is provided. The present invention computes a value of Row Parameter according to the size of the data frame, computes an index for a table according to the value of Row Parameter, and searches for a value of Column Parameter, a value of Prime Parameter and a value of Primitive Parameter from the table.

16 Claims, 13 Drawing Sheets

201

|      | CK | P  | V | CO |
|------|----|----|---|----|
| TI=0 | 0  | 7  | 3 | 1  |
| TI=1 | 2  | 11 | 2 | -1 |
| TI=2 | 4  | 11 | 2 | 1  |
| TI=3 | 1  | 13 | 2 | 0  |
| TI=4 | 7  | 17 | 3 | -1 |
| TI=5 | 0  | 17 | 3 | -1 |
| TI=6 | 2  | 17 | 3 | 1  |
| TI=7 | 4  | 19 | 2 | 1  |
| TI=8 | 7  | 23 | 5 | 0  |
| TI=9 | 3  | 23 | 5 | 0  |
| TI=10| 0  | 23 | 5 | 1  |
| TI=11| 7  | 29 | 2 | -1 |
| TI=12| 4  | 29 | 2 | -1 |
| TI=13| 1  | 29 | 2 | 0  |
| TI=14| 3  | 31 | 3 | 0  |

203

|      | CK | P  | V | CO |
|------|----|----|---|----|
| TI=0 | 7  | 11 | 2 | -1 |
| TI=1 | 7  | 11 | 2 | 0  |
| TI=2 | 7  | 13 | 2 | 0  |
| TI=3 | 6  | 13 | 2 | 1  |
| TI=4 |    |    |   |    |
| TI=5 | 5  | 17 | 3 | 0  |
| TI=6 | 7  | 19 | 2 | 0  |
| TI=7 | 7  | 23 | 5 | -1 |
| TI=8 |    |    |   |    |
| TI=9 | 7  | 23 | 5 | 1  |
| TI=10| 7  | 29 | 2 | -1 |
| TI=11|    |    |   |    |
| TI=12| 7  | 29 | 2 | 0  |
| TI=13| 6  | 29 | 2 | 1  |
| TI=14| 7  | 31 | 3 | 1  |

205

|      | CK | P  | V | CO |
|------|----|----|---|----|
| TI=0 |    |    |   |    |
| TI=1 |    |    |   |    |
| TI=2 |    |    |   |    |
| TI=3 | 7  | 17 | 3 | -1 |
| TI=4 |    |    |   |    |
| TI=5 | 7  | 17 | 3 | 1  |
| TI=6 |    |    |   |    |
| TI=7 |    |    |   |    |
| TI=8 |    |    |   |    |
| TI=9 |    |    |   |    |
| TI=10|    |    |   |    |
| TI=11|    |    |   |    |
| TI=12|    |    |   |    |
| TI=13| 7  | 31 | 3 | 0  |
| TI=14|    |    |   |    |

|       | CK | P  | V | CO |
|-------|----|----|---|----|
| TI = 0 | 0  | 17 | 3 | 1  |
| TI = 1 | 4  | 17 | 3 | -1 |
| TI = 2 | 8  | 19 | 2 | -1 |
| TI = 3 | 15 | 53 | 2 | 0  |
| TI = 4 | 15 | 53 | 2 | 0  |
| TI = 5 | 15 | 53 | 2 | 0  |
| TI = 6 | 1  | 53 | 2 | 0  |

209

|       | CK | P  | V | CO |
|-------|----|----|---|----|
| TI = 0 | 10 | 17 | 3 | 0  |
| TI = 1 | 14 | 19 | 2 | 0  |
| TI = 2 |    |    |   |    |
| TI = 3 |    |    |   |    |
| TI = 4 |    |    |   |    |
| TI = 5 |    |    |   |    |
| TI = 6 |    |    |   |    |

211

|       | CK | P  | V | CO |
|-------|----|----|---|----|
| TI = 0 | 15 | 17 | 3 | -1 |
| TI = 1 | 15 | 19 | 2 | -1 |
| TI = 2 |    |    |   |    |
| TI = 3 |    |    |   |    |
| TI = 4 |    |    |   |    |
| TI = 5 |    |    |   |    |
| TI = 6 |    |    |   |    |

Fig. 2B

|  | CK | P | V | CO |
|---|---|---|---|---|
| TI = 0 | 19 | 11 | 3 | 0 |
| TI = 1 | 7 | 11 | 3 | -1 |
| TI = 2 | 15 | 13 | 2 | -1 |
| TI = 3 | 23 | 17 | 3 | 1 |
| TI = 4 | 11 | 17 | 3 | 0 |
| TI = 5 | 19 | 19 | 2 | 0 |
| TI = 6 | 7 | 19 | 2 | -1 |
| TI = 7 | 15 | 23 | 5 | 1 |
| TI = 8 | 3 | 23 | 5 | 0 |
| TI = 9 | 29 | 29 | 2 | 1 |
| TI = 10 | 17 | 29 | 2 | 0 |
| TI = 11 | 5 | 29 | 2 | -1 |
| TI = 12 | 13 | 31 | 3 | -1 |
| TI = 13 | 31 | 37 | 2 | 1 |
| TI = 14 | 29 | 37 | 2 | 1 |
| TI = 15 | 17 | 37 | 2 | 0 |

| TI = 31 | 5 | 61 | 2 | -1 |
|---|---|---|---|---|
| TI = 32 | 31 | 67 | 2 | 1 |
| TI = 33 | 21 | 67 | 2 | 1 |
| TI = 34 | 9 | 67 | 2 | 0 |
| TI = 35 | 31 | 71 | 7 | 1 |
| TI = 36 | 5 | 71 | 7 | 1 |
| TI = 37 | 13 | 71 | 7 | -1 |
| TI = 38 | 1 | 73 | 5 | 0 |
| TI = 39 | 31 | 79 | 3 | 1 |
| TI = 40 | 31 | 79 | 3 | 1 |
| TI = 41 | 5 | 79 | 3 | 1 |
| TI = 42 | 13 | 79 | 3 | -1 |
| TI = 43 | 21 | 83 | 2 | 1 |
| TI = 44 | 9 | 83 | 2 | 0 |
| TI = 45 | 31 | 89 | 3 | 1 |

| TI = 16 | 5 | 37 | 2 | -1 |
|---|---|---|---|---|
| TI = 17 | 13 | 41 | 6 | 1 |
| TI = 18 | 1 | 41 | 6 | 0 |
| TI = 19 | 9 | 43 | 3 | 0 |
| TI = 20 | 31 | 47 | 5 | 1 |
| TI = 21 | 5 | 47 | 5 | 1 |
| TI = 22 | 13 | 47 | 5 | -1 |
| TI = 23 | 31 | 53 | 2 | 1 |
| TI = 24 | 29 | 53 | 2 | 1 |
| TI = 25 | 17 | 53 | 2 | 0 |
| TI = 26 | 5 | 53 | 2 | -1 |
| TI = 27 | 31 | 59 | 2 | 1 |
| TI = 28 | 21 | 59 | 2 | 1 |
| TI = 29 | 9 | 59 | 2 | 0 |
| TI = 30 | 17 | 61 | 2 | 0 |

| TI = 46 | 31 | 89 | 3 | 1 |
|---|---|---|---|---|
| TI = 47 | 13 | 89 | 3 | 1 |
| TI = 48 | 1 | 89 | 3 | 0 |
| TI = 49 | 31 | 97 | 5 | 1 |
| TI = 50 | 31 | 97 | 5 | 1 |
| TI = 51 | 31 | 97 | 5 | 1 |
| TI = 52 | 13 | 97 | 5 | 1 |
| TI = 53 | 1 | 97 | 5 | 0 |
| TI = 54 | 29 | 101 | 2 | 1 |
| TI = 55 | 17 | 101 | 2 | 0 |
| TI = 56 | 5 | 101 | 2 | -1 |
| TI = 57 | 13 | 103 | 5 | -1 |
| TI = 58 | 21 | 107 | 2 | 1 |
| TI = 59 | 9 | 107 | 2 | 0 |
| TI = 60 | 17 | 109 | 6 | 0 |
| TI = 61 | 5 | 109 | 6 | -1 |

Fig. 2C

| | | | | |
|---|---|---|---|---|
| TI = 62 | 13 | 113 | 3 | 1 |
| TI = 63 | 1 | 113 | 3 | 0 |
| TI = 64 | 31 | 127 | 3 | 1 |
| TI = 65 | 31 | 127 | 3 | 1 |
| TI = 66 | 31 | 127 | 3 | 1 |
| TI = 67 | 31 | 127 | 3 | 1 |
| TI = 68 | 31 | 127 | 3 | 1 |
| TI = 69 | 31 | 127 | 3 | 1 |
| TI = 70 | 31 | 127 | 3 | 1 |
| TI = 71 | 5 | 127 | 3 | 1 |
| TI = 72 | 13 | 127 | 3 | -1 |
| TI = 73 | 21 | 131 | 2 | 1 |
| TI = 74 | 9 | 131 | 2 | 0 |
| TI = 75 | 31 | 137 | 3 | 1 |

| | | | | |
|---|---|---|---|---|
| TI = 91 | 5 | 157 | 5 | -1 |
| TI = 92 | 31 | 163 | 2 | 1 |
| TI = 93 | 21 | 163 | 2 | 1 |
| TI = 94 | 9 | 163 | 2 | 0 |
| TI = 95 | 31 | 167 | 5 | 1 |
| TI = 96 | 5 | 167 | 5 | 1 |
| TI = 97 | 13 | 167 | 5 | -1 |
| TI = 98 | 31 | 173 | 2 | 1 |
| TI = 99 | 29 | 173 | 2 | 1 |
| TI = 100 | 17 | 173 | 2 | 0 |
| TI = 101 | 5 | 173 | 2 | -1 |
| TI = 102 | 31 | 179 | 2 | 1 |
| TI = 103 | 21 | 179 | 2 | 1 |
| TI = 104 | 9 | 179 | 2 | 0 |
| TI = 105 | 17 | 181 | 2 | 0 |

| | | | | |
|---|---|---|---|---|
| TI = 76 | 31 | 137 | 3 | 1 |
| TI = 77 | 13 | 137 | 3 | 1 |
| TI = 78 | 1 | 137 | 3 | 0 |
| TI = 79 | 9 | 139 | 2 | 0 |
| TI = 80 | 31 | 149 | 2 | 1 |
| TI = 81 | 31 | 149 | 2 | 1 |
| TI = 82 | 31 | 149 | 2 | 1 |
| TI = 83 | 31 | 149 | 2 | 1 |
| TI = 84 | 29 | 149 | 2 | 1 |
| TI = 85 | 17 | 149 | 2 | 0 |
| TI = 86 | 5 | 149 | 2 | -1 |
| TI = 87 | 13 | 151 | 6 | -1 |
| TI = 88 | 31 | 157 | 5 | 1 |
| TI = 89 | 29 | 157 | 5 | 1 |
| TI = 90 | 17 | 157 | 5 | 0 |

| | | | | |
|---|---|---|---|---|
| TI = 106 | 5 | 181 | 2 | -1 |
| TI = 107 | 31 | 191 | 19 | 1 |
| TI = 108 | 31 | 191 | 19 | 1 |
| TI = 109 | 31 | 191 | 19 | 1 |
| TI = 110 | 31 | 191 | 19 | 1 |
| TI = 111 | 5 | 191 | 19 | 1 |
| TI = 112 | 13 | 191 | 19 | -1 |
| TI = 113 | 1 | 193 | 5 | 0 |
| TI = 114 | 29 | 197 | 2 | 1 |
| TI = 115 | 17 | 197 | 2 | 0 |
| TI = 116 | 5 | 197 | 2 | -1 |
| TI = 117 | 13 | 199 | 3 | -1 |
| TI = 118 | 31 | 211 | 2 | 1 |
| TI = 119 | 31 | 211 | 2 | 1 |
| TI = 120 | 31 | 211 | 2 | 1 |

Fig. 2D

| | | | | |
|---|---|---|---|---|
| TI = 121 | 31 | 211 | 2 | 1 |
| TI = 122 | 31 | 211 | 2 | 1 |
| TI = 123 | 21 | 211 | 2 | 1 |
| TI = 124 | 9 | 211 | 2 | 0 |
| TI = 125 | 31 | 223 | 3 | 1 |
| TI = 126 | 31 | 223 | 3 | 1 |
| TI = 127 | 31 | 223 | 3 | 1 |
| TI = 128 | 31 | 223 | 3 | 1 |
| TI = 129 | 31 | 223 | 3 | 1 |
| TI = 130 | 31 | 223 | 3 | 1 |
| TI = 131 | 5 | 223 | 3 | 1 |
| TI = 132 | 13 | 223 | 3 | -1 |
| TI = 133 | 21 | 227 | 2 | 1 |
| TI = 134 | 9 | 227 | 2 | 0 |
| TI = 135 | 17 | 229 | 6 | 0 |

| | | | | |
|---|---|---|---|---|
| TI = 136 | 5 | 229 | 6 | -1 |
| TI = 137 | 13 | 233 | 3 | 1 |
| TI = 138 | 1 | 233 | 3 | 0 |
| TI = 139 | 31 | 239 | 7 | 1 |
| TI = 140 | 31 | 239 | 7 | 1 |
| TI = 141 | 5 | 239 | 7 | 1 |
| TI = 142 | 13 | 239 | 7 | -1 |
| TI = 143 | 1 | 241 | 7 | 0 |
| TI = 144 | 31 | 251 | 6 | 1 |
| TI = 145 | 31 | 251 | 6 | 1 |
| TI = 146 | 31 | 251 | 6 | 1 |
| TI = 147 | 31 | 251 | 6 | 1 |
| TI = 148 | 21 | 251 | 6 | 1 |
| TI = 149 | 9 | 251 | 6 | 0 |
| TI = 150 | 31 | 257 | 3 | 1 |
| TI = 151 | 31 | 257 | 3 | 1 |
| TI = 152 | 7 | 257 | 3 | 1 |

Fig. 2E

|        | CK | P  | V | CO |
|--------|----|----|---|----|
| TI = 0  | 31 | 11 | 3 | -1 |
| TI = 1  | 27 | 13 | 2 | 0  |
| TI = 2  | 31 | 17 | 3 | 1  |
| TI = 3  | 31 | 17 | 3 | 0  |
| TI = 4  | 31 | 17 | 3 | -1 |
| TI = 5  | 31 | 19 | 2 | -1 |
| TI = 6  | 31 | 23 | 5 | 1  |
| TI = 7  | 31 | 23 | 5 | 0  |
| TI = 8  | 23 | 23 | 5 | -1 |
| TI = 9  | 31 | 29 | 2 | 0  |
| TI = 10 | 31 | 29 | 2 | -1 |
| TI = 11 | 25 | 31 | 3 | 0  |
| TI = 12 | 31 | 37 | 2 | 1  |
| TI = 14 | 31 | 37 | 2 | 0  |
| TI = 15 | 31 | 37 | 2 | -1 |

| TI = 16 | 31 | 41 | 6 | 1  |
|---------|----|----|---|----|
| TI = 17 | 31 | 41 | 6 | 0  |
| TI = 18 | 21 | 41 | 6 | -1 |
| TI = 19 | 29 | 43 | 3 | -1 |
| TI = 21 | 25 | 47 | 5 | 0  |
| TI = 22 | 31 | 53 | 2 | 1  |
| TI = 24 | 31 | 53 | 2 | 0  |
| TI = 25 | 31 | 53 | 2 | -1 |
| TI = 26 | 31 | 59 | 2 | 1  |
| TI = 28 | 31 | 59 | 2 | 0  |
| TI = 29 | 29 | 59 | 2 | -1 |
| TI = 30 | 31 | 61 | 2 | -1 |
| TI = 31 | 31 | 67 | 2 | 1  |
| TI = 33 | 31 | 67 | 2 | 0  |
| TI = 34 | 29 | 67 | 2 | -1 |

| TI = 36 | 25 | 71  | 7 | 0  |
|---------|----|-----|---|----|
| TI = 37 | 31 | 73  | 5 | 0  |
| TI = 38 | 21 | 73  | 5 | -1 |
| TI = 41 | 25 | 79  | 3 | 0  |
| TI = 42 | 31 | 83  | 2 | 1  |
| TI = 43 | 31 | 83  | 2 | 0  |
| TI = 44 | 29 | 83  | 2 | -1 |
| TI = 47 | 31 | 89  | 3 | 0  |
| TI = 48 | 21 | 89  | 3 | -1 |
| TI = 52 | 31 | 97  | 5 | 0  |
| TI = 53 | 21 | 97  | 5 | -1 |
| TI = 54 | 31 | 101 | 2 | 0  |
| TI = 55 | 31 | 101 | 2 | -1 |
| TI = 56 | 25 | 103 | 5 | 0  |
| TI = 57 | 31 | 107 | 2 | 1  |
| TI = 58 | 31 | 107 | 2 | 0  |

| TI = 59 | 29 | 107 | 2 | -1 |
|---------|----|-----|---|----|
| TI = 60 | 31 | 109 | 6 | -1 |
| TI = 61 | 31 | 113 | 3 | 1  |
| TI = 62 | 31 | 113 | 3 | 0  |
| TI = 63 | 21 | 113 | 3 | -1 |
| TI = 71 | 25 | 127 | 3 | 0  |
| TI = 72 | 31 | 131 | 2 | 1  |
| TI = 73 | 31 | 131 | 2 | 0  |
| TI = 74 | 29 | 131 | 2 | -1 |
| TI = 77 | 31 | 137 | 3 | 0  |
| TI = 78 | 21 | 137 | 3 | -1 |
| TI = 79 | 29 | 139 | 2 | -1 |
| TI = 84 | 31 | 149 | 2 | 0  |
| TI = 85 | 31 | 149 | 2 | -1 |
| TI = 86 | 25 | 151 | 6 | 0  |

Fig. 2F

| | | | | |
|---|---|---|---|---|
| TI = 87 | 31 | 157 | 5 | 1 |
| TI = 89 | 31 | 157 | 5 | 0 |
| TI = 90 | 31 | 157 | 5 | -1 |
| TI = 91 | 31 | 163 | 2 | 1 |
| TI = 93 | 31 | 163 | 2 | 0 |
| TI = 94 | 29 | 163 | 2 | -1 |
| TI = 96 | 25 | 167 | 5 | 0 |
| TI = 97 | 31 | 173 | 2 | 1 |
| TI = 99 | 31 | 173 | 2 | 0 |
| TI = 100 | 31 | 173 | 2 | -1 |
| TI = 101 | 31 | 179 | 2 | 1 |
| TI = 103 | 31 | 179 | 2 | 0 |
| TI = 104 | 29 | 179 | 2 | -1 |
| TI = 105 | 31 | 181 | 2 | -1 |
| TI = 106 | 31 | 191 | 19 | 1 |

| | | | | |
|---|---|---|---|---|
| TI = 111 | 25 | 191 | 19 | 0 |
| TI = 112 | 31 | 193 | 5 | 0 |
| TI = 113 | 21 | 193 | 5 | -1 |
| TI = 114 | 31 | 197 | 2 | 0 |
| TI = 115 | 31 | 197 | 2 | -1 |
| TI = 116 | 25 | 199 | 3 | 0 |
| TI = 117 | 31 | 211 | 2 | 1 |
| TI = 123 | 31 | 211 | 2 | 0 |
| TI = 124 | 29 | 211 | 2 | -1 |
| TI = 131 | 25 | 223 | 3 | 0 |
| TI = 132 | 31 | 227 | 2 | 1 |
| TI = 133 | 31 | 227 | 2 | 0 |
| TI = 134 | 29 | 227 | 2 | -1 |
| TI = 135 | 31 | 229 | 6 | -1 |
| TI = 136 | 31 | 233 | 3 | 1 |
| TI = 137 | 31 | 233 | 3 | 0 |

| | | | | |
|---|---|---|---|---|
| TI = 138 | 21 | 233 | 3 | -1 |
| TI = 141 | 25 | 239 | 7 | 0 |
| TI = 142 | 31 | 241 | 7 | 0 |
| TI = 143 | 21 | 241 | 7 | -1 |
| TI = 148 | 31 | 251 | 6 | 0 |
| TI = 149 | 29 | 251 | 6 | -1 |

Fig. 2G

|  | CK | P | V | CO |
|---|---|---|---|---|
| TI = 1 | 31 | 13 | 2 | -1 |
| TI = 11 | 31 | 31 | 3 | -1 |
| TI = 18 | 31 | 43 | 3 | 0 |
| TI = 19 | 31 | 47 | 5 | 1 |
| TI = 21 | 31 | 47 | 5 | -1 |
| TI = 29 | 31 | 61 | 2 | 0 |
| TI = 34 | 31 | 71 | 7 | 1 |
| TI = 36 | 31 | 71 | 7 | -1 |
| TI = 38 | 31 | 79 | 3 | 1 |
| TI = 41 | 31 | 79 | 3 | -1 |
| TI = 44 | 31 | 89 | 3 | 1 |
| TI = 48 | 31 | 97 | 5 | 1 |
| TI = 53 | 31 | 101 | 2 | 1 |
| TI = 56 | 31 | 103 | 5 | -1 |
| TI = 59 | 31 | 109 | 6 | 0 |
| TI = 63 | 31 | 127 | 3 | 1 |

| TI = 71 | 31 | 127 | 3 | -1 |
|---|---|---|---|---|
| TI = 74 | 31 | 137 | 3 | 1 |
| TI = 78 | 31 | 139 | 2 | 0 |
| TI = 79 | 31 | 149 | 2 | 1 |
| TI = 86 | 31 | 151 | 6 | -1 |
| TI = 94 | 31 | 167 | 5 | 1 |
| TI = 96 | 31 | 167 | 5 | -1 |
| TI = 104 | 31 | 181 | 2 | 0 |
| TI = 111 | 31 | 191 | 19 | -1 |
| TI = 113 | 31 | 197 | 2 | 1 |
| TI = 116 | 31 | 199 | 3 | -1 |
| TI = 124 | 31 | 223 | 3 | 1 |
| TI = 131 | 31 | 223 | 3 | -1 |
| TI = 134 | 31 | 229 | 6 | 0 |
| TI = 138 | 31 | 239 | 7 | 1 |
| TI = 141 | 31 | 239 | 7 | -1 |
| TI = 143 | 31 | 251 | 6 | 1 |
| TI = 149 | 31 | 257 | 3 | 1 |

Fig. 2H

METHOD FOR INTERLEAVING DATA FRAME AND CIRCUIT THEREOF

CROSS-REFERENCE TO RELATED APPLICATIONS

This Application claims priority to Taiwan Patent Application No. 093110101 filed on Apr. 12, 2004.

FIELD OF INVENTION

The present invention relates to a method for interleaving a plurality of data in a data frame and a circuit thereof. The method and the circuit are adapted for a turbo coder implemented to encode data under the regulation of 3rd generation partnership project (3GPP).

BACKGROUND OF THE INVENTION

Turbo coding is frequently applied to modern communication systems because of low power and narrow bandwidth requirement. One characteristic of turbo coding is that there is an interleaver used to re-arrange the order of a plurality of data in a data frame prior to data transmission.

Under the regulation of 3GPP, data are processed, or interleaved, by referring to four parameters: a row parameter, a column parameter, a prime parameter and a primitive parameter. The row and column parameters are configured to generate a new column address. The column, prime and primitive parameters are configured to generate a new row address. According to the new column and row addresses, the interleaver interleaves the data.

FIG. 1 shows a block diagram of an interleaver implemented for 3GPP. The interleaver includes an interleaver parameter calculator 101, a column address generator 103, a row address generator 105 and an adder 107. The interleaver parameter calculator 101 is configured to receive a datum 100, and, according to the datum 100, to calculate to output a row parameter 102, a column parameter 104, a prime parameter 106 and a primitive parameter 108. The column address generator 103 is configured to receive the row parameter 102 and the column parameter 104 to generate a column address 110. The row address generator 105 is configured to receive the column parameter 104, the prime parameter 106 and the primitive parameter 108 to generate a row address 112. The column address 110 and the row address 112, after being calculated by the adder 107, form an interleaving address 114, which is used to interleave the datum 100.

The interleaver parameter calculator 101 of the prior art includes a table configured to store all available values of the four parameters 102, 104, 106 and 108. Under the regulation of 3GPP, the row parameter 102, the column parameter 104, the prime parameter 106 and the primitive parameter 108 are respectively 5 bits, 9 bits, 9 bits and 5 bits, and the valid sizes of a data frame are in a range from 40 to 5114, which means that the table has 5075 rows. Therefore, the table of the interleaver parameter calculator 101 needs a total of (5+9+9+5)×5075=142100 bits. When the interleaver is implemented by means of VLSI technology, cost will stay high because the table occupies a large IC area.

SUMMARY OF THE INVENTION

The present invention provides a method for a turbo coder to interleave a plurality of data in a data frame. The turbo coder, following 3GPP regulations, has a table particularly designed and is able to interleave the plurality of data according to a row parameter R, a column parameter C, a prime parameter P and a primitive parameter V.

The method includes the steps of receiving and storing the data frame; calculating a value of the row parameter R according to a size K of the data frame; calculating a table index TI corresponding to the table according to the value of the row parameter R; looking up the table to obtain a value of the column parameter C, a value of the prime parameter P and a value of the primitive parameter V according to the table index TI; and interleaving the plurality of data according to the value of the row parameter R, the value of the column parameter C, the value of the prime parameter P and the value of the primitive parameter V.

The step of looking up the table further includes: looking up the table according to the table index TI to obtain at least one possible value of the prime parameter P, at least one possible value of the primitive parameter V, at least one possible value of a column offset parameter CO, and at least one possible value of a check parameter CK; comparing a plurality of least significant bits LSB of the table index TI with at least one possible value of the check parameter CK to respectively select the appropriate values of the prime parameter P, the primitive parameter V, and the column offset parameter CO from the at least one possible value of the prime parameter P, the at least one possible value of the primitive parameter V and at least one possible value of a column offset parameter CO; and calculating the value of the column parameter C according to the value of the column offset parameter CO.

The method, which can be implemented by a computer, reduces the layout size of the table so that cost is saved.

The present invention further provides an interleaver parameter calculator adapted for the above-mentioned turbo coder. The interleaver parameter calculator includes a first circuit array, a second circuit array, a control circuit and a third circuit array. The first circuit array is configured to receive a datum D from the plurality of data and, according to a plurality of particular values, perform subtraction calculation to generate a plurality of first signals. The second circuit array is configured to receive the plurality of first signals and generate a plurality of second signals and third signals, wherein the second signals include information of the size of the data frame and the third signals include the information of the datum D. The control circuit is configured to receive the second signals and, according to the size of the data frame, generate a control signal and a value of the row parameter. The third circuit array is configured to receive the third signals and, according to the control signal, select a value of the column parameter, a value of prime parameter and a value of primitive parameter.

BRIEF DESCRIPTION OF THE DRAWINGS

FIG. 2A illustrates a table for R=5;
FIG. 2B illustrates a table for R=10;
FIGS. 2C-E illustrate a first sub-table for R=20;
FIGS. 2F-G illustrate a second sub-table for R=20;
FIG. 2H illustrates a third sub-table for R=20.

DETAILED DESCRIPTION

The method of the present invention utilizes a set of equations in order to derive a value of the row parameter R, and re-builds the table according to the properties of the row parameter R, the column parameter C, the prime parameter P and the primitive parameter V under 3GPP regulations. The present invention further simplifies the table by introducing two additional parameters: a column offset parameter CO and a check parameter CK. FIG. 2 (FIGS. 2A-H) shows the simplified table. According to the regulations of 3GPP, the row parameter R includes three possible values: R=5, R=10 and R=20. FIG. 2A shows the table for R=5, including a first sub-table 201, a second sub-table 203 and a third sub-table 205. FIG. 2B shows the table for R=10, including a first sub-table 207, a second sub-table 209 and a third sub-table 211. FIGS. 2C-E show a first sub-table for R=20. FIGS. 2F-G show a second sub-table for R=20. FIG. 2H shows a third sub-table for R=20. It is noted that some rows are ignored in the second and third sub-tables for R=20 if the corresponding parameters are invalid.

As FIG. 2 shows, the tables or sub-tables applied to the present invention include four parameters: a check parameter CK, a prime parameter P, a primitive parameter V and a column offset parameter CO, wherein the check parameter CK is adapted to check which row of the tables is desired and the column offset parameter CO is adapted to derive the column parameter 104. According to the tables, values of the row parameter 102, the column parameter 104, the prime parameter 106 and the primitive parameter 108 under 3GPP regulations can be derived.

Figure 1:
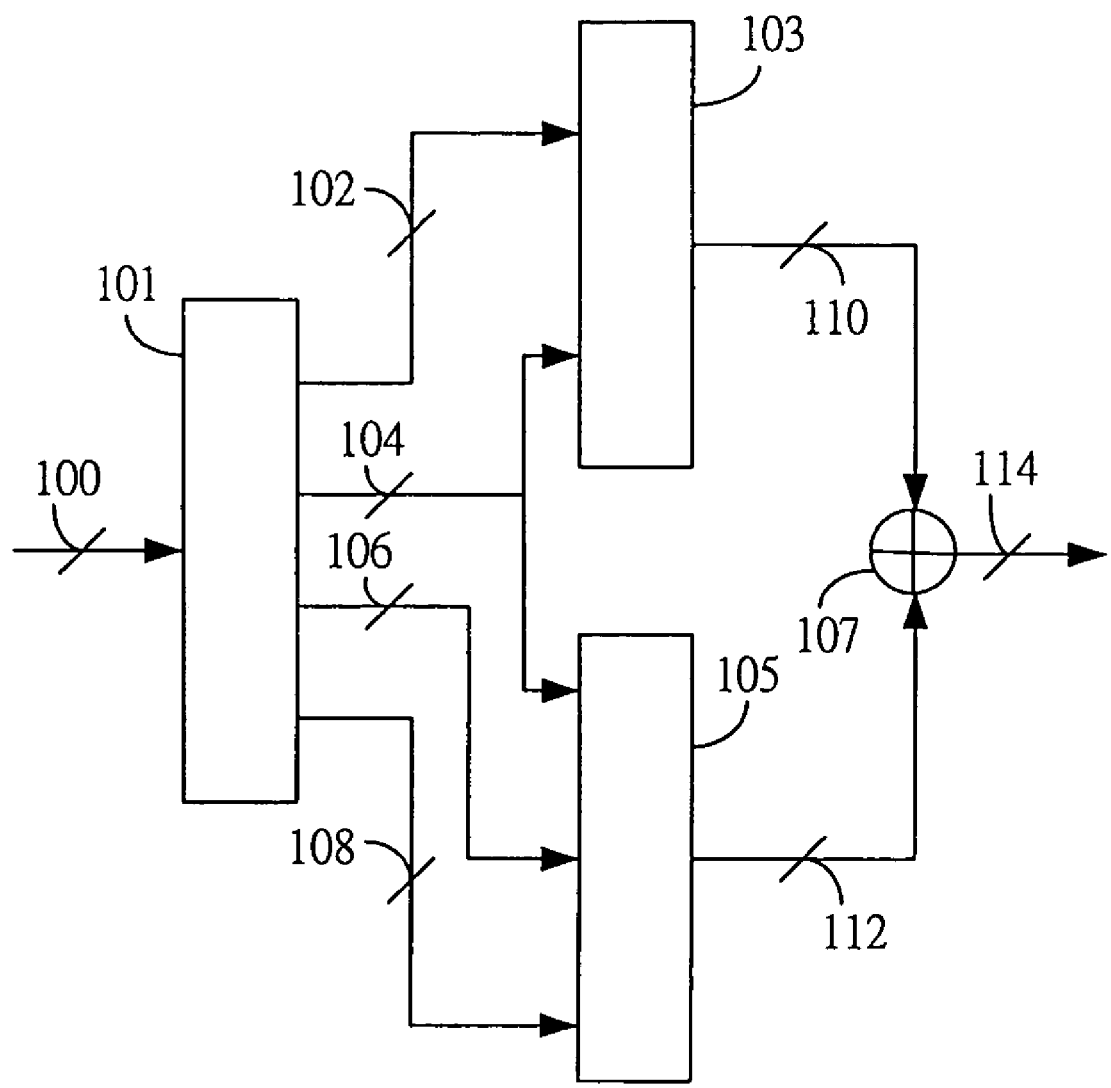
FIG. 1 illustrates an interleaver of the prior art.
Figure 3:
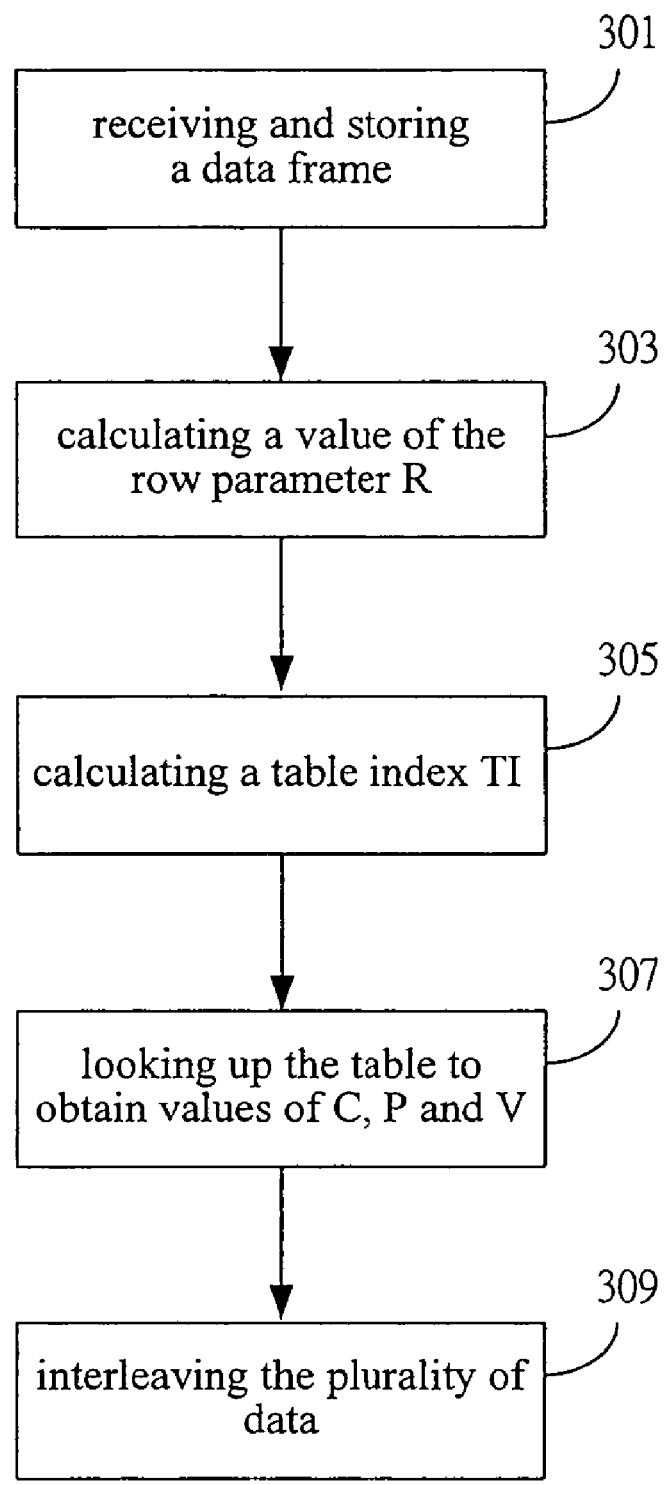
FIG. 3 illustrates a flow chart of the present invention.

The method of the present invention is shown in FIG. 3. In step 301, an interleaver receives and stores a data frame. More particularly, the interleaver receives and stores the data in the data frame in order. In step 303, a value of the row parameter R is calculated according to a size K of the data frame. In step 305, a table index TI corresponding to the table shown in FIG. 2 is calculated according to the value of the row parameter R derived in step 303. In step 307, looking up the table, according to the table index TI derived in step 305, is executed to obtain a value of the column parameter C, a value of the prime parameter P and a value of the primitive parameter V. In step 309, the interleaver interleaves the plurality of data according to an interleaving address formed by the values of the row parameter R, the column parameter C, the prime parameter P and the primitive parameter V. More detailed descriptions of some steps are set forth below.

In step 303, the value of the row parameter R is derived by a first set of equations:

if $40 \leq K \leq 159$, R=5;

if $160 \leq K \leq 200$ or $481 \leq K \leq 530$, R=10; and if K=otherwise, R=20.

i.e., the row parameter R has three possible values (5, 10 and 20) and is determined by the size K of the data frame.

In step 305, the value of the table index TI corresponding to the table is derived by a second set of equations:

when $R = 5$, $TI = \left[\frac{K - 40}{8}\right]$;

-continued when $R = 10$ and $160 \leq K \leq 200$, $TI = \left[\frac{K - 160}{16}\right]$;

when $R = 10$ and $481 \leq K \leq 530$, $TI = \left[\frac{K - 481}{16}\right]$;

when $R = 20$ and $201 \leq K \leq 481$, $TI = \left[\frac{K - 210}{32}\right]$; and when $R = 20$ and $530 \leq K$, $TI = \left[\frac{K - 531}{32}\right]$.

The value of the table index TI is associated with the row parameter R and the size K of the data frame. It is noted that the symbol [ ] denotes Gaussian calculation which takes the quotient and ignores the remainder.

Figure 4:
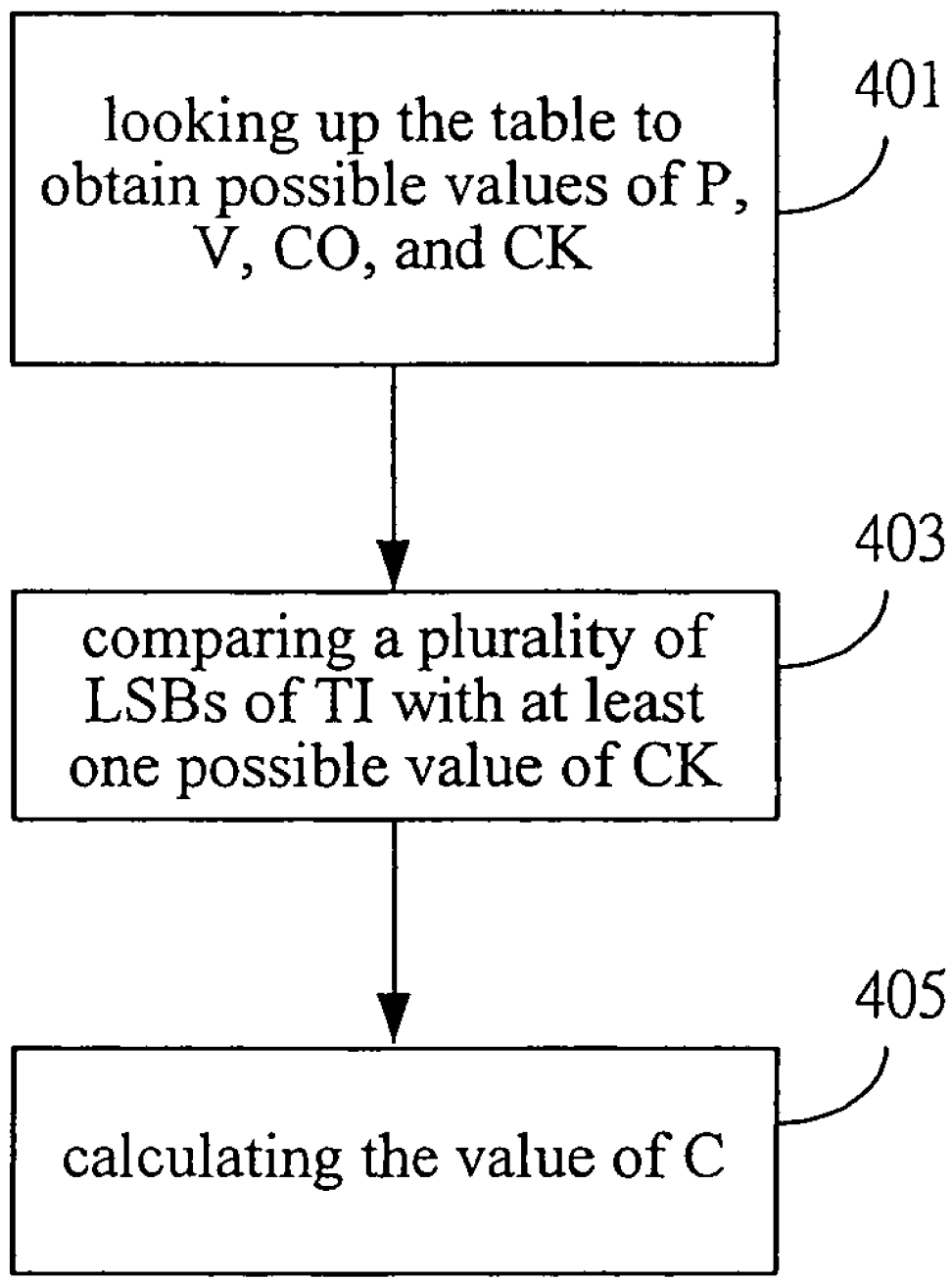
FIG. 4 illustrates a flow chart when step 307 of the present invention is executed.

Step 307 further includes the steps shown in FIG. 4. Step 401 includes looking up the table according to the table index TI derived in step 305 to obtain at least one possible value of the prime parameter P, at least one possible value of the primitive parameter V, at least one possible value of the column offset parameter CO, and at least one possible value of the check parameter CK. In step 403, a plurality of least significant bits LSB of the table index TI are compared with at least one possible value of the check parameter CK. The comparison ways are: when R=5, comparing three least significant bits LSB of the table index TI with at least one possible value of the check parameter CK; when R=10, comparing four least significant bits LSB of the table index TI with at least one possible value of the check parameter CK; and when R=20, comparing five least significant bits LSB of the table index TI with at least one possible value of the check parameter CK. The table index TI whose least significant bits are smaller than or equal to the value of the check parameter CK is the desired table index TI. Based on the desired table index TI, the values of the prime parameter P, the primitive parameter V, and the column offset parameter CO are respectively and appropriately selected from those possible values of the prime parameter P, the primitive parameter V and the column offset parameter CO. In step 405, the value of the column parameter C is calculated according to the value of the column offset parameter CO and the prime parameter P. A third equation to derive the value of the column parameter C is:

$C=CO+P$

The check parameter CK and the column offset parameter CO for the table of the present invention are both 5 bits at most, and the prime parameter P and the primitive parameter V under 3GPP regulations are respectively 9 bits and 5 bits. Therefore, the required bits for all four parameters are 24 bits. There are 30 valid rows of the table for R=5, 11 valid rows of the table for R=10 and 285 valid rows of the table for R=20. Accordingly, the required bits are 24*(30+11+285)=7824 in total. Its layout area is only 5.5% of that of the table of prior art (142100 bits). This layout area reduction saves a lot of cost.

An example is described herein to expound the characteristics of the present invention. Assume that a data frame with K=71 is received in step 301. In step 303, the value of the row parameter R can be derived to be 5 according to the first set of equations. As FIG. 2A shows, the table for R=5 includes the first sub-table 201, the second sub-table 203 and the third sub-table 205. In step 305, TI can be derived to be 3 according to the second set of equations $$\left(TI = \left[\frac{71-40}{8}\right] = 3\right).$$

In step 401, three possible rows (bold frames in the sub-tables 201, 203 and 205) whose TIs are equal to 3 are determined by looking up the table. Therefore, the possible values of CK, P, V and CO are: CK=1, P=13, V=2, CO=0 for the first sub-table 201; CK=6, P=13, V=2, CO=1 for the second sub-table 203; and CK=7, P=17, V=3, CO=−1 for the third sub-table 205. Since R=5, three least significant bits LSB of the table index TI ($(71-40)_{mod}2^3=7$) are compared with the three possible values of the check parameter CK in step 403. One can observe that only the CK value of the sub-table 205 is not smaller than the three least significant bits LSB of the table index TI so the corresponding P, V and CO values (P=17, V=3 and CO=−1) are determined. In step 405, C can be derived by using the third equation and the value is C=CO+P=−1+17=16. Accordingly, the parameters for interleaving data are R=5, C=16, P=17 and V=3. The interleaver then is able to interleave data based on these parameters in step 309.

Figure 5:
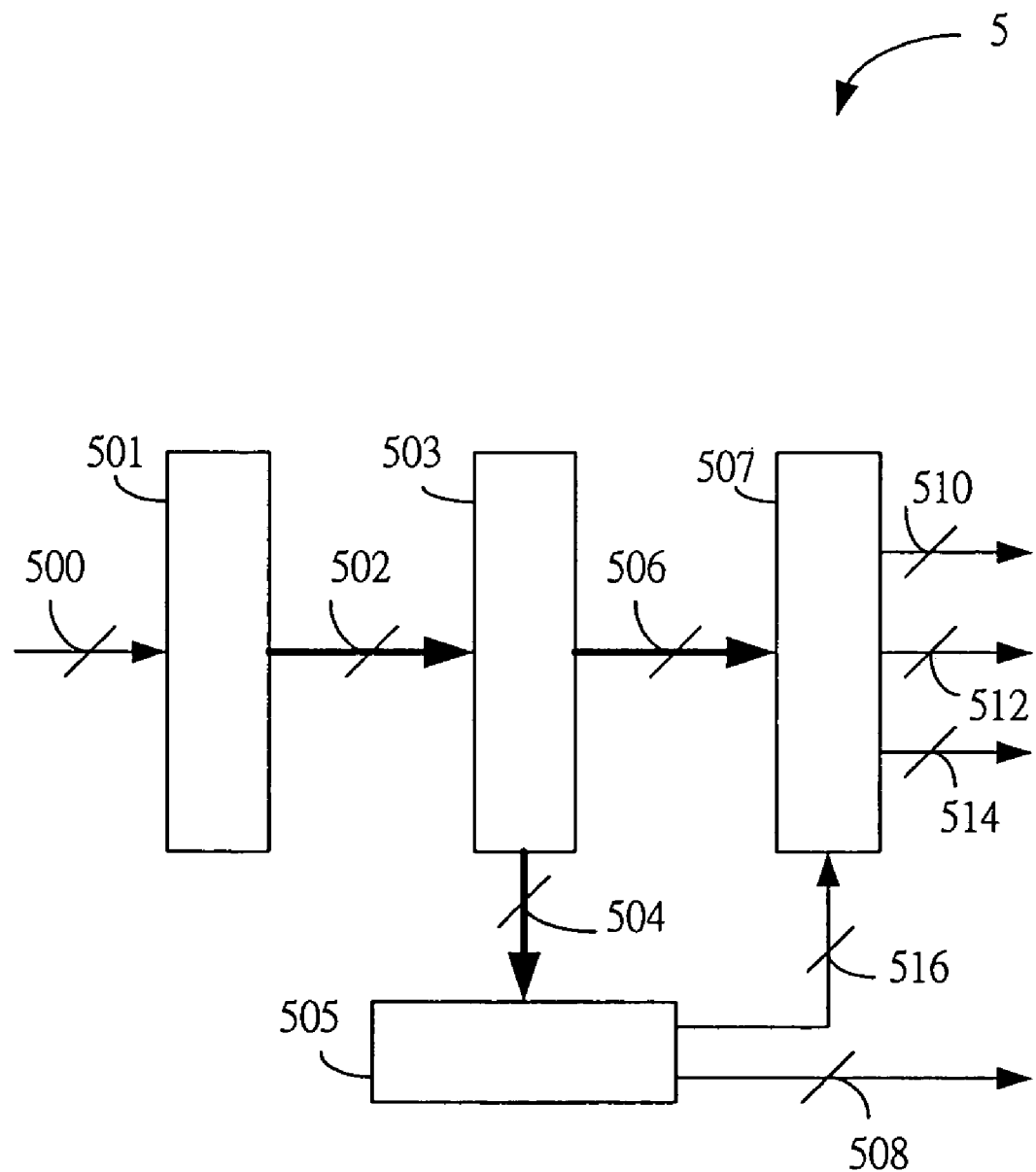
FIG. 5 illustrates an interleaver parameter calculator in accordance with the present invention.

The present invention further provides an interleaver parameter calculator for generating the above-mentioned parameters. FIG. 5 shows an interleaver parameter calculator 5 that includes a first circuit array 501, a second circuit array 503, a control circuit 505 and a third circuit array 507. The first circuit array 501 is configured to receive a datum 500 of a data frame and, according to a plurality of particular values associated with the first set of equations, to perform subtraction calculation to generate a plurality of first signals 502. The second circuit array 503 is configured to receive the first signals 502 and to generate a plurality of second signals 504 and third signals 506, wherein the second signals 504 include information of the size K of the data frame and the third signals 506 include the datum 500. The control circuit 505 is configured to receive the second signals 504 and, according to the size K of the data frame, to generate a control signal 516 and a value of the row parameter 508. The third circuit array 507 is configured to receive the third signals 506 and, according to the control signal 516, to select a value of the column parameter 510, a value of prime parameter 512 and a value of primitive parameter 514. It is noted that each of the bold signal lines in FIG. 5 represents that more than one signal is transmitted thereby.

Figure 6:
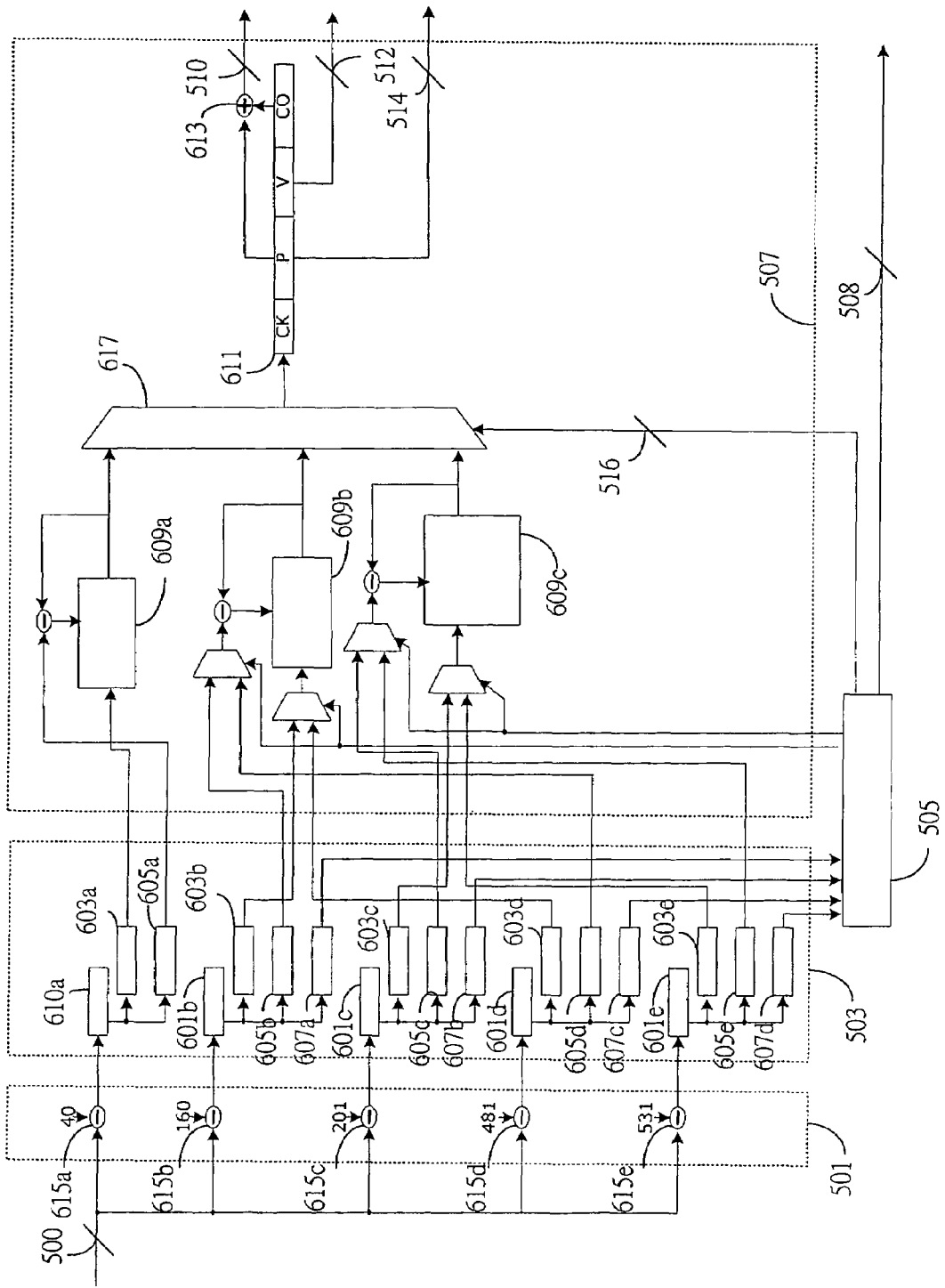
FIG. 6 illustrates the circuitry of the interleaver parameter calculator.

FIG. 6 shows an embodiment of the interleaver parameter calculator 5. The first circuit array 501 includes five subtracters to respectively perform subtraction calculation according to one of five particular values, wherein the first value adapted for a first subtracter 615a is 40, the second value adapted for a second subtracter 615b is 160, the third value adapted for a third subtracter 615c is 201, the fourth value adapted for a fourth subtracter 615d is 481 and the fifth value adapted for a fifth subtracter 615e is 531. The second circuit array 503 receives signals 601a-e (i.e., the first signals 502 in FIG. 5) and generates signals 603a-e, signals 605a-e and signals 607a-d. The signals 605a-e indicate the above-mentioned least significant bits LSB. The signals 603a-e indicate the signals 601a-e excluding the least significant bits LSB. The signals 607a-d indicate a positive value or a negative value after the datum 500 is subtracted by the first circuit array 501. The signals 603a-e and the signals 605a-e together form the third signals 506 in FIG. 5. The signals 607a-d form the second signals 504 in FIG. 5.

The third circuit array 507 of the interleaver parameter calculator 5 includes tables 609a-c which are identical to the tables shown in FIG. 2 respectively for R=5, R=10 and R=20. The third circuit array 507 receives the signals 603a-e to obtain table indexes to look up the tables and, therefore, derives at least one possible value of the prime parameter P, at least one possible value of the primitive parameter V, at least one possible value of the column offset parameter CO, and at least one possible value of the check parameter CK. The third circuit array 507 subsequently compares the signal 605a-e with at least one possible value of the check parameter CK, and, according to the control signal 516, selects the value of the column offset parameter CO by a multiplexer 617, the value 514 of the prime parameter P and the value 512 of the primitive parameter V as a row 611 shows. The value 510 of the column parameter C can be derived by adding the value of the column offset parameter CO and the value 514 of the prime parameter P by an adder 613.

The control circuit 505 can determine and output the value 508 of the row parameter R according to the signals 607a-d. For example, if the signals 607a-d are all negative, it means the size K of the data frame being less than 160 and the control circuit 505 determines R=5.

The above description of the preferred embodiments is expected to clearly expound the characteristics of the present invention but not expected to restrict the scope of the present invention. Those skilled in the art will readily observe that numerous modifications and alterations of the method and the interleaver parameter calculator may be made while retaining the teaching of the invention. Accordingly, the above disclosure should be construed as limited only by the bounds of the claims.

What is claimed is:

1. A method for a turbo coder to interleave a plurality of data in a data frame, the turbo coder having a table and interleaving the plurality of data according to a row parameter R, a column parameter C, a prime parameter P and a primitive parameter V, the method comprising:

receiving and storing the data frame;

calculating a value of the row parameter R according to a size K of the data frame;

calculating a table index TI corresponding to the table according to the value of the row parameter R;

looking up the table to obtain a value of the column parameter C, a value of the prime parameter P and a value of the primitive parameter V according to the table index TI; and interleaving the plurality of data according to the value of the row parameter R, the value of the column parameter C, the value of the prime parameter P and the value of the primitive parameter V.

2. The method of claim 1, wherein the value of the row parameter R is derived by the following equations:

if $40 \leq K \leq 159$, R=5;

if $160 \leq K \leq 200$ or $481 \leq K \leq 530$, R=10; and if K=otherwise, R=20.

3. The method of claim 2, wherein the table index TI corresponding to the table is derived by the following equations:

$$\text{when } R = 5, TI = \left[\frac{K-40}{8}\right];$$

-continued when $R = 10$ and $160 \leq K \leq 200$, $TI = \left[\frac{K - 160}{16}\right]$;

when $R = 10$ and $481 \leq K \leq 530$, $TI = \left[\frac{K - 481}{16}\right]$;

when $R = 20$ and $201 \leq K \leq 481$, $TI = \left[\frac{K - 210}{32}\right]$; and when $R = 20$ and $530 \leq K$, $TI = \left[\frac{K - 531}{32}\right]$.

4. The method of claim 3, wherein the step of looking up the table further comprises:
looking up the table according to the table index TI to obtain at least one possible value of the prime parameter P, at least one possible value of the primitive parameter V, at least one possible value of a column offset parameter CO, and at least one possible value of a check parameter CK;
comparing a plurality of least significant bits LSB of the table index TI with at least one possible value of the check parameter CK to respectively select the value of the prime parameter P, the value of the primitive parameter V, and a value of the column offset parameter CO from the at least one possible value of the prime parameter P, the at least one possible value of the primitive parameter V and at least one possible value of a column offset parameter CO; and
calculating the value of the column parameter C according to the value of the column offset parameter CO.

5. The method of claim 4, wherein the comparing step further comprises:
when R=5, comparing three least significant bits LSB of the table index TI with at least one possible value of the check parameter CK;
when R=10, comparing four least significant bits LSB of the table index TI with at least one possible value of the check parameter CK; and
when R=20, comparing five least significant bits LSB of the table index TI with at least one possible value of the check parameter CK.

6. The method of claim 4, wherein the value of the column parameter C is derived by the following equation:

$C=CO+P$.

7. An interleaver parameter calculator for generating a row parameter, a column parameter, a prime parameter and a primitive parameter for a turbo coder to interleave a plurality of data in a data frame, comprising:
a first circuit array for receiving a datum D from the plurality of data and, according to a plurality of particular values, performing subtraction calculation to generate a plurality of first signals;
a second circuit array for receiving the plurality of first signals and generating a plurality of second signals and third signals, wherein the plurality of second signals comprise information of a size of the data frame and the plurality of third signals comprise the datum D;
a control circuit for receiving the plurality of second signals and, according to the size of the data frame, generating a control signal and a value of the row parameter; and
a third circuit array for receiving the plurality of third signals and, according to the control signal, selecting a value of the column parameter, a value of prime parameter and a value of primitive parameter.

8. The interleaver parameter calculator of claim 7, wherein the first circuit array comprises:
a first subtracter for performing subtraction calculation according to a first value of the plurality of particular values, wherein the first value is 40;
a second subtracter for performing subtraction calculation according to a second value of the plurality of particular values, wherein the second value is 160;
a third subtracter for performing subtraction calculation according to a third value of the plurality of particular values, wherein the third value is 201;
a fourth subtracter for performing subtraction calculation according to a fourth value of the plurality of particular values, wherein the fourth value is 481; and
a fifth subtracter for performing subtraction calculation according to a fifth value of the plurality of particular values, wherein the fifth value is 531.

9. The interleaver parameter calculator of claim 7, the interleaver parameter calculator comprising a table, each of the plurality of third signals comprising information corresponding to an index of the table and a plurality of least significant bits of the datum D, the third circuit array looking up the table and, according to the index, obtaining at least one possible value of the prime parameter, at least one possible value of the primitive parameter, at least one possible value of a column offset parameter, and at least one possible value of a check parameter, the third circuit array comparing the plurality of least significant bits with at least one possible value of the check parameter, and, according to the control signal, selecting a value of the column offset parameter, the value of the prime parameter and the value of the primitive parameter.

10. The interleaver parameter calculator of claim 9, wherein the value of the column parameter is derived by adding the value of the column offset parameter and the value of the prime parameter.

11. A computer-implemented method for a turbo coder to interleave a plurality of data in a data frame, the turbo coder having a table and interleaving the plurality of data according to a row parameter R, a column parameter C, a prime parameter P and a primitive parameter V, the method comprising:
receiving and storing the data frame;
calculating a value of the row parameter R according to a size K of the data frame;
calculating a table index TI corresponding to the table according to the value of the row parameter R;
looking up the table to obtain a value of the column parameter C, a value of the prime parameter P and a value of the primitive parameter V according to the table index TI; and
interleaving the plurality of data according to the value of the row parameter R, the value of the column parameter C, the value of the prime parameter P and the value of the primitive parameter V.

12. The computer-implemented method of claim 11, wherein the value of the row parameter R is derived by the following equations:

if $40 \leq K \leq 159$, R=5;

if $160 \leq K \leq 200$ or $481 \leq K \leq 530$, R=10; and if K=otherwise, R=20.

13. The computer-implemented method of claim 12, wherein the table index TI corresponding to the table is derived by the following equations:

when $R = 5$, $TI = \left[\frac{K-40}{8}\right]$;

when $R = 10$ and $160 \leq K \leq 200$, $TI = \left[\frac{K-160}{16}\right]$;

when $R = 10$ and $481 \leq K \leq 530$, $TI = \left[\frac{K-481}{16}\right]$;

when $R = 20$ and $201 \leq K \leq 481$, $TI = \left[\frac{K-210}{32}\right]$; and when $R = 20$ and $530 \leq K$, $TI = \left[\frac{K-531}{32}\right]$.

14. The computer-implemented method of claim 13, wherein the step of looking up the table further comprises:
looking up the table according to the table index TI to obtain at least one possible value of the prime parameter P, at least one possible value of the primitive parameter V, at least one possible value of a column offset parameter CO, and at least one possible value of a check parameter CK;
comparing a plurality of least significant bits LSB of the table index TI with at least one possible value of the check parameter CK to respectively select the value of the prime parameter P, the value of the primitive parameter V, and a value of the column offset parameter CO from the at least one possible value of the prime parameter P, the at least one possible value of the primitive parameter V and at least one possible value of a column offset parameter CO; and
calculating the value of the column parameter C according to the value of the column offset parameter CO.

15. The computer-implemented method of claim 14, wherein the comparing step further comprises:
when R=5, comparing three least significant bits LSB of the table index TI with at least one possible value of the check parameter CK;
when R=10, comparing four least significant bits LSB of the table index TI with at least one possible value of the check parameter CK; and
when R=20, comparing five least significant bits LSB of the table index TI with at least one possible value of the check parameter CK.

16. The computer-implemented method of claim 14, wherein the value of the column parameter C is derived by the following equation:

$C = CO + P.$

* * * * *